(12) United States Patent
Asao et al.

(10) Patent No.: US 6,977,620 B2
(45) Date of Patent: Dec. 20, 2005

(54) HIGH FREQUENCY PACKAGE

(75) Inventors: Hideki Asao, Tokyo (JP); Hiroshi Osakada, Tokyo (JP); Hideyuki Oohashi, Tokyo (JP); Kyouko Shinozaki, Tokyo (JP); Kenji Tatano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/824,503

(22) Filed: Apr. 15, 2004

(65) Prior Publication Data

US 2005/0104792 A1    May 19, 2005

(30) Foreign Application Priority Data

Nov. 14, 2003    (JP) ............................. 2003-384948

(51) Int. Cl.[7] ........................................ H01Q 13/10
(52) U.S. Cl. ..................................... 343/770; 343/767
(58) Field of Search ....................... 343/700 MS, 767, 343/770, 789, 829, 846

(56) References Cited

U.S. PATENT DOCUMENTS

| | | | | |
|---|---|---|---|---|
| 6,128,194 A | * | 10/2000 | Francis ....................... | 361/737 |
| 6,133,877 A | * | 10/2000 | Sandstedt et al. .... | 343/700 MS |
| 6,556,456 B1 | * | 4/2003 | Takehara ................... | 361/818 |
| 2003/0048148 A1 | * | 3/2003 | Humphreys et al. ...... | 333/99 S |
| 2004/0080917 A1 | * | 4/2004 | Steddom et al. ............ | 361/748 |

FOREIGN PATENT DOCUMENTS

| | | | | |
|---|---|---|---|---|
| JP | 5-110310 | | 4/1993 | |
| JP | 5-121888 | | 5/1993 | |
| JP | 6-236935 | | 8/1994 | |
| JP | 11-224911 | | 8/1999 | |
| JP | 2002329800 A | * | 11/2002 | ........... H01L 23/10 |

* cited by examiner

*Primary Examiner*—Tho Phan
(74) *Attorney, Agent, or Firm*—Oblon, Spivak, McClelland, Maier & Neustadt, P.C.

(57) ABSTRACT

High frequency packages have a plurality of apertures (notches) as antennas, and each of these apertures possesses a specific resonance frequency that may exist within the frequency bandwidth used in the high frequency packages in a high frequency band. Thus, the resonance frequency produced within the package is shifted outside the frequency bandwidth. A high frequency package is provided with a metal frame disposed on a metal bottom plate and having apertures for connecting with external terminals, dielectrics being disposed on the bottom metal plate, and on which a high frequency transmission line and a plurality of input and output terminals are formed, microwave circuitry being contained in the metal frame, and a metal lid, wherein the frequency of the aperture's resonance arising from electromagnetic field between the metal frame and the metal bottom plate, is shifted outside the frequency bandwidth by diminishing and optimizing the width of the aperture.

5 Claims, 7 Drawing Sheets

HIGH FREQUENCY PACKAGE

BACKGROUND OF THE INVENTION

1. Field of the Invention

The present invention relates to high frequency packages that contain semiconductor devices, optical semiconductor devices, and circuitries that use and control high frequency signals for microwave, millimeter wave, and optical communications in satellite, mobile, and aviation/marine communications.

2. Description of the Related Art

FIG. 1 of Japanese Laid-Open Patent Publication 2002-329800 discloses a substrate 4 loaded with a semiconductor device 2 thereon and a frame 7 that defines in its sides attaching areas 6, consisting of notches, for attaching input/output terminals 5. In addition, with FIG. 2 of the above-mentioned publication, a provision is made for transmission that covers an upper high-frequency bandwidth, by arranging a ceramic standing wall 10 in the notch and providing a groove 20 in the under-side of the standing wall 10, and by filling up the groove with a resin layer 11 having a dielectric constant less than that of ceramics so that the electrostatic capacitance between a line conductor 8 and the ground plane on the upper side of the standing wall 10 is diminished. Moreover, a range into which the resonance point of a high-frequency signal is upwardly shifted is discussed in terms of the relationship between the width of the groove 20 and the line conductor 8.

FIG. 1, both in Japanese Laid-Open Patent Publication 1993-110310 and in 1993-121888, disclose methods to shift upward or downward the resonance frequency of a cavity resonator by changing the size of the space between the package and the lid so as to avert generating a resonance that intrudes into the operating-frequency bandwidth of a microwave circuitry.

With the conventional semiconductor packages, an upward shift of a cut-off frequency determined by the capacitance between the ground conducting plane on the upper side of the standing wall and the line conductor has been discussed; however, effects on high frequency transmission lines (RF lines) caused by the notches themselves in the frame that contains the standing walls have not been set forth. In other words, as regards leakage and influx of unnecessary electric waves from RF lines typified by feedthroughs and from feedthrough lines for biasing, the notches (apertures) in the frame behave as slot antennas having specific resonance frequencies, and the resonance frequencies of the notches often reside in quantity within the frequency bandwidth in a high frequency band.

SUMMARY OF THE INVENTION

The present invention has been implemented in order to address the foregoing issues; an object of the invention is to provide a high frequency package shifted the resonance-frequency bandwidth of a slot-antenna resonance, which occurs in the high frequency package, outside the frequency bandwidth used in the high frequency package and to eliminate unnecessary radio waves (reflected waves) within the frequency bandwidth that occur in semiconductor devices and microwave circuitries. Another object of the present invention is to provide a high frequency package that prevents from deteriorating transmission-line performance even if unnecessary radio waves have relatively wide bandwidths.

There is provided a high frequency package according to the present invention, including a ground plate; a metal frame disposed on the ground plate and having an aperture for connection with an external terminal; dielectrics disposed on the ground plate, and on which a high frequency transmission line and a plurality of input and output terminals are formed; semiconductor circuitry contained in the metal frame; connecting portions which connect the semiconductor circuitry to the input and output terminals; and a metal lid for covering the space that the metal frame embraces, wherein the frequency of the slot-resonance arising from electromagnetic resonance between the metal frame and the ground plate, is shifted outside the limit of the frequency bandwidth used in the semiconductor circuitry by changing the width of the aperture.

There is provided a high frequency package according to another aspect of the present invention, including: a ground plate; a metal frame disposed on the ground plate and having an aperture for the connection with an external terminal; dielectrics disposed on the ground plate, and on which a high frequency transmission line and a plurality of input and output terminals are formed; semiconductor circuitry contained in the metal frame; connecting portions which connect the semiconductor circuitry to the input and output terminals; a metal lid for covering the space that the metal frame embraces; and slot antenna apertures provided in the metal frame and having a width that is different from that of said aperture in the metal frame, wherein the frequency of the slot antenna slot resonance arising from electromagnetic resonance between the metal frame and the metal ground plane, is set to unnecessary frequency within the frequency bandwidth used in the semiconductor circuitry by changing the width of the slot antenna aperture.

An effect obtaining a high frequency package having a stable frequency bandwidth against resonance phenomena that occur in the apertures of the high frequency package is demonstrated by changing the width of each aperture so as to shift the slot resonance frequencies outside the used frequency bandwidth.

Another effect is demonstrated wherein a high frequency package unaffected by the unnecessary radio wave arising in semiconductor devices and microwave circuitries is obtained by setting the frequency of the slot antenna resonance occurring within the frequency bandwidth used in the high frequency package to the frequency of the unnecessary radio wave by changing the width of the aperture. Moreover, an advantage is demonstrated of being able to obtain a high frequency package that prevents from deteriorating transmission-line performance even though the unnecessary radio waves have relatively wide bandwidths.

DETAILED DESCRIPTION OF THE PREFERRED EMBODIMENT

Embodiment 1

Figure 1:
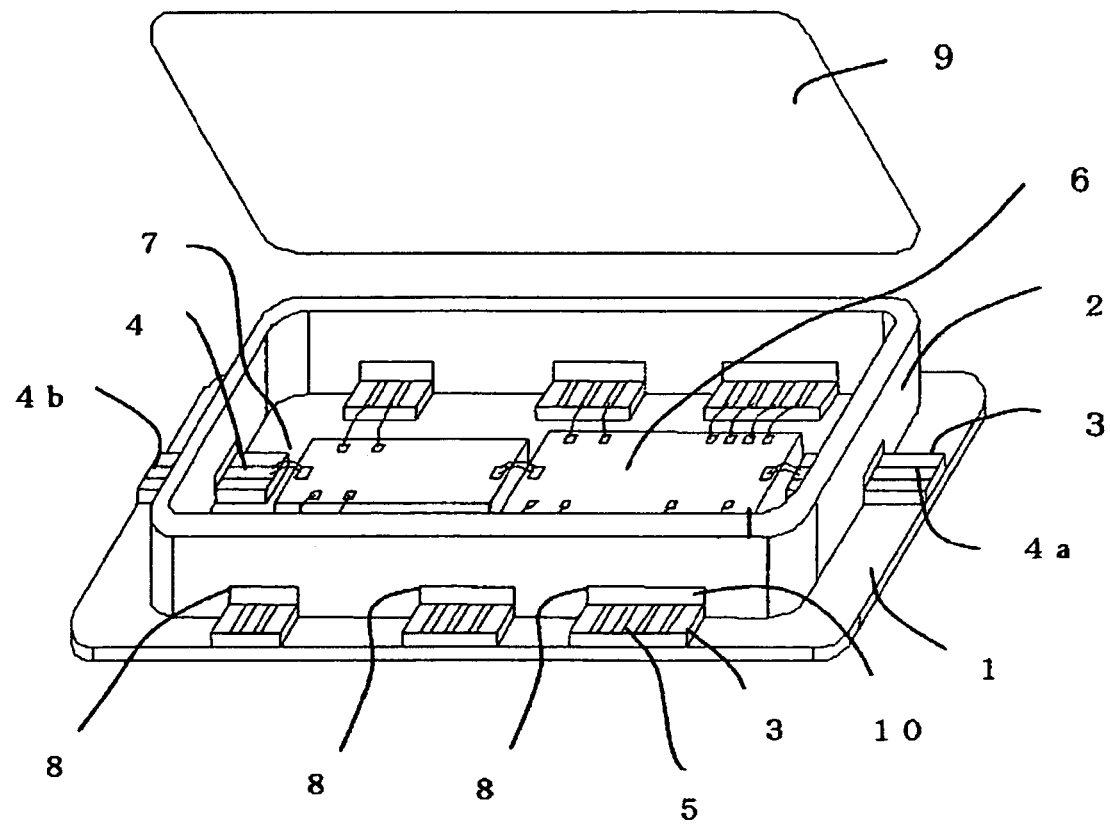
FIG. 1 is an external view of a high frequency package according to Embodiment 1 of the present invention.

FIG. 1 is an external view illustrating Embodiment 1 of a high frequency package according to the present invention. In FIG. 1, at 1 is a bottom plate (ground plate) made of a Fe—Ni—Co alloy; at 2 is a frame (metal frame) made of the same alloy as that for the metal ground plane 1; at 3 are ceramic boards (dielectrics) separately or integrally disposed on the bottom plate 1; and a high frequency input terminal (input terminal) and a high frequency output terminal (output terminal) each formed on the surface of each one of the ceramic boards 3 are indicated by 4a and 4b, and both of the input and output terminals form a transmission line (feed-through line) 4. At 5 are bias terminals that are formed on the surfaces of the ceramic boards 3 and that supply control signals and electric power; at 6 is microwave circuitry (semiconductor circuitry) including microstrip lines (MSL), semiconductor devices, and thick- and thin-film circuits; at 7 are gold wires that connect the microwave circuitries 6, wherein the high-frequency input and output terminals (RF terminals) 4a and 4b, and bias terminals 5 are also connected by the gold wires to the microwave circuitries 6; at 8 are apertures (slot apertures) that are disposed in the vicinity of the RF terminals 4a and 4b and the bias terminals 5 connected to external terminals (not illustrated) and that are defined by notches in the frame 2; and at 9 is a lid (metal lid) that is made of the Fe—Ni—Co alloy and that covers the frame 2. At 10 is a standing ceramic wall that is disposed in the aperture 8 and is made of an insulating material with approximately the same thickness as that of the frame 2, and the ceramic board 3 and the standing ceramic wall 10 fill the cross-sectional space of the aperture 8.

Figure 2:
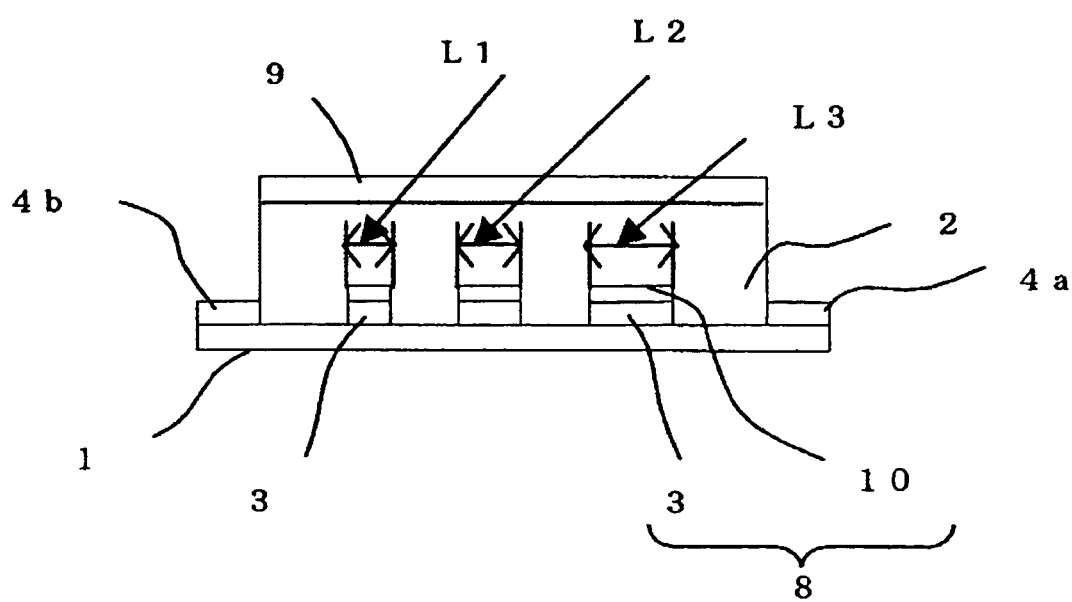
FIG. 2 is a side view of the high frequency package according to Embodiment 1 of the present invention.

FIG. 2 is a side view of the high frequency package according to Embodiment 1, and each of the apertures 8 for the bias terminals 5 is different in width (L1, L2 and L3). The reason why the apertures of the bias terminals 5 are different in width (L) is that input/output between the apertures and external terminals is carried out through different-numbers of control signal lines and electric power lines that form the bias terminals 5. If the patterns connected to the bias terminal 5 each have a pattern width of, e.g., 0.2 mm and are spaced apart by 0.3 mm from each other, when four patterns in parallel are connected to the bias terminal 5, the aperture width will be 2.5 mm.

The operations of the high-frequency package will be explained. As an example, an approximately 10-GHz microwave signal inputted through the input terminal 4a of the transmission line 4 having a volume of 12 mm width, 16 mm length, and 2.5 mm height is outputted through the output terminal 4b after being processed by each of circuit elements (such as amplifiers, phase shifters, directional couplers, and nonlinear elements) within the microwave circuitry 6. In carrying out this signal processing, since it is necessary to apply digital signals, electric power, and bias voltages through the bias terminals 5 that are appropriately arranged along the transmission line 4, signals from the external terminals are fed through the bias terminals 5 in the vicinity of the apertures 8 provided in the frame 2 to the microwave circuitry 6.

Through the transmission line 4, microwaves mainly propagate in the region between a pattern of a Ni—Cr—Cu—Au thin film conductor formed on the surface of the dielectric 3 and the sole plate (ground plate) or thin film conductor pattern (not illustrated) disposed on the whole under surface of the dielectrics. In addition, connections to the semiconductor circuitry (microwave circuitry) 6 interposed along the transmission line 4 are made by connecting bonding pads on the top surface of the semiconductor devices and bonding pad patterns provided along the course of the transmission line 4 with the gold wires 7; or the transmission line 4 may directly be connected with the semiconductor circuitries 6 by soldering (heat fusing) Au—Pb-solder bump terminals disposed beneath the semiconductor device with the bonding pad patterns disposed at a position along the transmission line 4. Patterns connected to the bias terminals 5 are made of the same material as that of the transmission line 4 and are connected to the semiconductor circuitries 6 by the gold wires 7. Accordingly, these patterns also serve as secondary transmission lines.

Meanwhile, in designing the microwave circuitry, pattern and internal-dimension designs for the package are often carried out for a central frequency within a used frequency bandwidth, which therefore uniquely determines the optimal frequency band. For this reason, in frequency bandwidths other than the optimal frequency band, unnecessary resonances and oscillations may occur. A plurality of these resonances and unnecessary oscillations may be scattered over a bandwidth defined as the used band, and may range over a relatively wide bandwidth. In cases where an amplifier is interposed, as in Embodiment 1 of the present invention, unnecessary oscillations additionally occur due to spurious signals and modulation distortions that are generated in non-linear amplification regions. Moreover, this may also be increased by electromagnetic radiation from microscopic connecting elements such as the gold wires 7 that lie along the transmission line 4.

Figure 3:
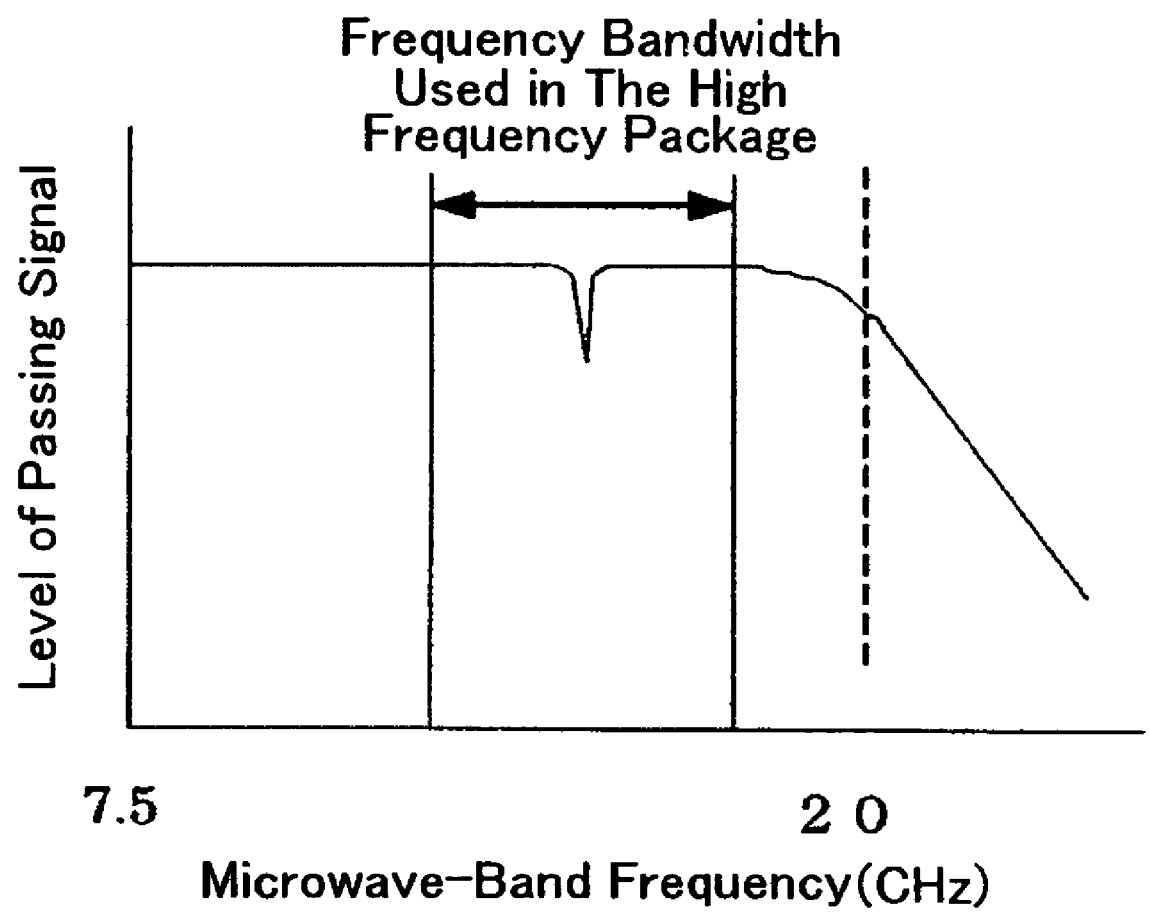
FIG. 3 is a graph representing a resonance phenomenon in a used frequency bandwidth.

FIG. 3 represents passing characteristics of microwave circuitry for which a high frequency package according to Embodiment 1 of the present invention was employed. Generally speaking, used frequency bands are determined based on definitions as to what is within the used frequency band (in-band frequencies) and what is outside the used frequency band (out-of-band frequencies). For the in-band frequencies, definitions are provided for transmission loss and gain across the bandwidth, while for the out-of-band frequencies, attenuation definitions are provided. FIG. 3 represents the case where resonance is observed within the actually used bandwidth. This case is one in which the earlier-described optimization planning in designing the inside dimensions of the package has not been carried out; in conventional countermeasures against unnecessary resonance, as set forth in Japanese Laid-Open Patent Publication 1993-121888 or 1993-110310, methods have been employed for changing resonance frequencies of cavity resonance by altering the total package volume or by appropriately inserting radio-wave absorbers. However, since, in high frequency transmission circuitry, as set forth above, a plurality of resonance waves may be present in the used frequency bandwidth, a resonance phenomenon may occur which cannot be coped with by altering the package space in order to shift the resonance frequencies nor by changing the used frequency bandwidth relative to the resonance frequencies. It has been ascertained that one of the causes of the occurrence of these resonances is related to the apertures 8 arranged in the package.

Figure 4:
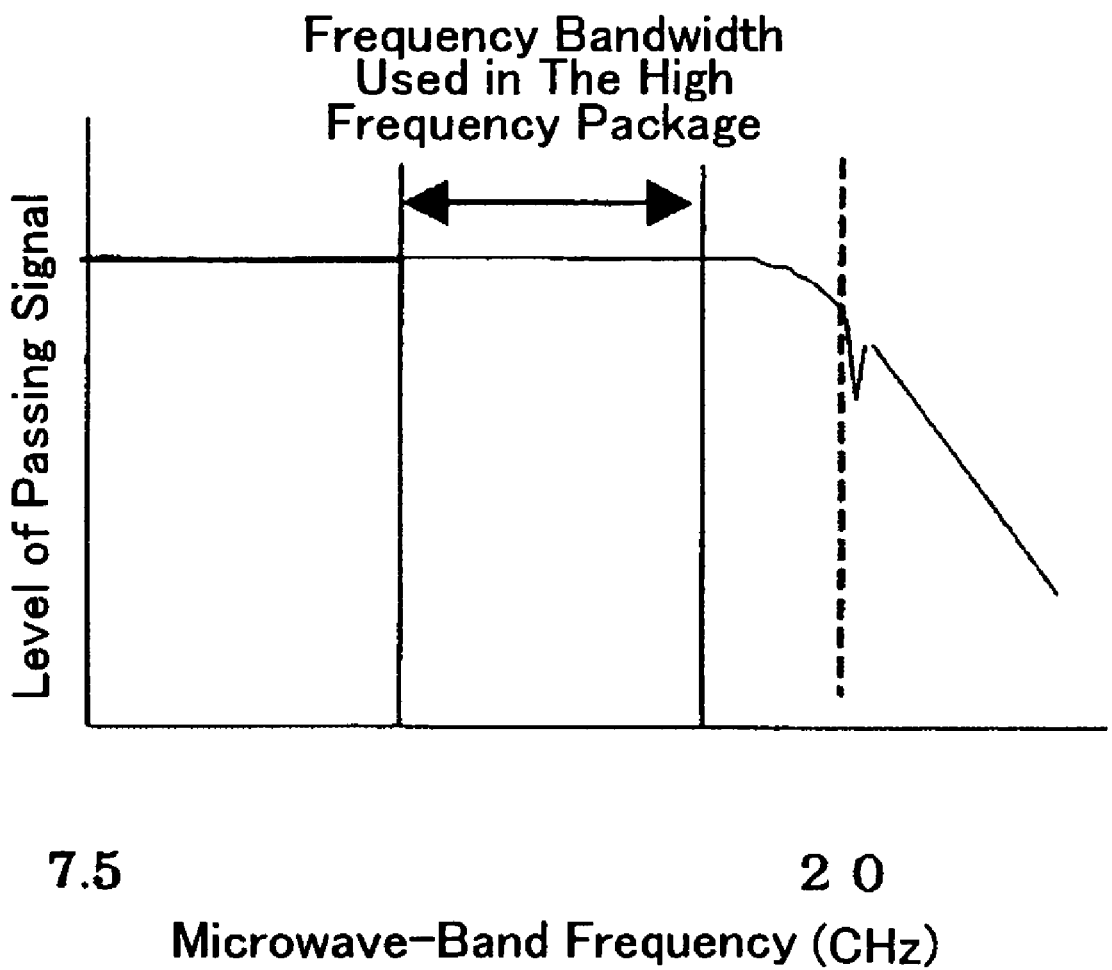
FIG. 4 is a graph representing the resonance phenomenon shifted outside the used frequency bandwidth.

That is to say, the aperture 8, as represented by a slot antenna, can be regarded as an aperture antenna for a wavelength of approximately half that of the electromagnetic wave radiated into the transmission space, and an electromagnetic field that leaks from the transmission line inside the package couples to the aperture antenna, so that an antenna resonance causes radiation of the electromagnetic wave with the resonance frequency. This results in electric power attenuated by the radiation, which is observed as resonance in the used frequency bandwidth. In Embodiment 1, by focusing attention on widths of the apertures and by setting them to aperture widths (L) as indicated in FIG. 2, the resonance phenomenon is prevented by shifting the resonance frequency from the used frequency bandwidth by the frequency width corresponding to half the wavelength of the resonance wave, as represented in FIG. 4.

This resonance phenomenon will be discussed in detail. In the aperture 8, since the frame 2 is partially notched, an electric-field distribution is produced in the space surrounded by the bottom plate 1 and the frame 2, i.e., in the ceramic board 3 and the ceramic wall 10. The direction of this electric field is perpendicular to the surface of the bias terminal 5 pattern and coincides with the electric-field distribution of the slot antenna. In this situation, the high frequency package amounts to possessing apertures (slot apertures) equivalent to independent slot antennas, which do not depend on the patterns of the bias terminal 5 formed on the ceramic board 3.

In FIG. 2, the width L3 of the aperture 8 is set to 2.5 mm. The height of the aperture is approximately equal to the sum of the thickness of the ceramic board 3 and that of ceramic wall 10. The pattern of the bias terminals 5 is some 3.0 $\mu$m in film thickness; the ceramic board 3, some 0.3 mm in thickness, and the ceramic wall 10, some 0.3 mm in thickness. In addition, for the connection with the external terminal, soldering pads and dedicated leads (not illustrated) are disposed on the bias terminal 5 located outside the frame 2; therefore, when a Cu—Mo—W thick-film material is employed as the patterns of the bias terminal 5, the thickness of the patterns of the bias terminal is on the order of 10 $\mu$m. Moreover, in Embodiment 1, the widths of the ceramic boards 3 and the apertures 8 are the same so as to maintain the gastightness. In other words, the cross sectional area of the aperture 8 is approximately equal to the summation of the cross sectional areas of the ceramic board 3 and the ceramic wall 10.

The aperture width L3 of the bias terminal 5 indicated in FIG. 2 is 2.5 mm and four lines of patterns having width of 0.2 mm are arranged spaced apart by 0.3 mm from each other. In such cases, an approximate slot-resonance frequency is given by the following equation:

$$fr = (C/\sqrt{\in r}) \cdot (n/2L)$$

wherein f r: resonance frequency, C: dielectric constant, n: constant, and L: aperture width For instance, if the dielectric constant of ceramic is 9.0, the constant n in basic mode (primary resonance mode) is 1, and the aperture width is 2.5 mm, then f r is 20 GHz.

Figure 5:
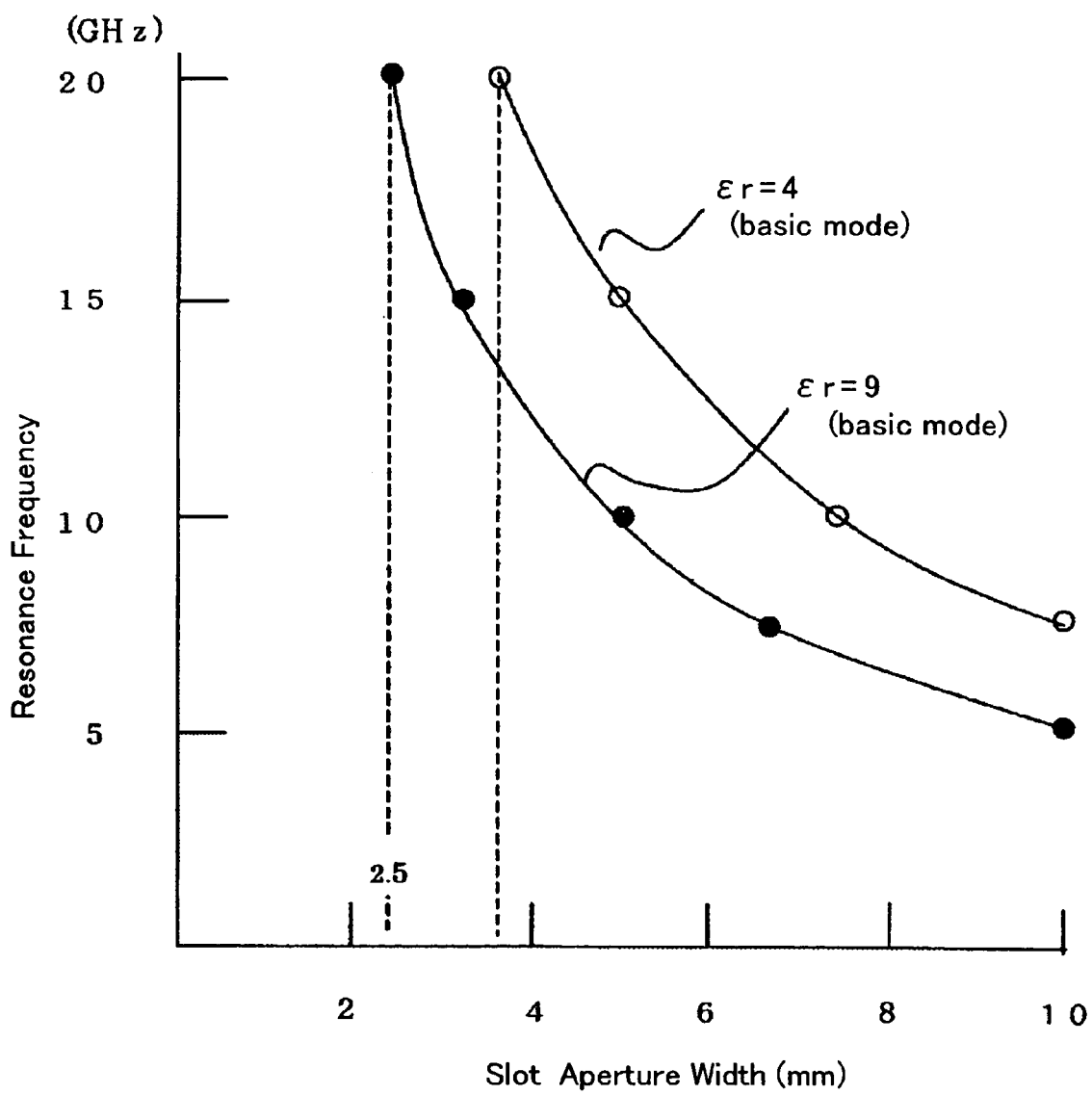
FIG. 5 is an explanatory view representing the relationship in the used frequency bandwidth between resonance frequency and aperture width.

FIG. 5 is a graph representing the relationship between the width (L) of the slot aperture 8 and the resonance frequency (f r), with the dielectric constant ($\in r$) as a parameter. In the present embodiment, the ceramic board 3 ($\in r=9$) and the ceramic wall 10 ($\in r=9$) are employed; however, in cases where an insulating material, e.g., a glass-epoxy board, is used, since its dielectric constant is approximately 4, the resonance phenomenon takes place at 20 GHz when the slot-aperture width is 3.75 mm.

In addition, since with the pattern width of the bias terminal 5 being less than 0.2 mm, the issues of drop in bias potential due to ohmic losses, and of impaired reliability under the application of great electric current arise, the bias-circuit functionality of the high frequency package deteriorates. Accordingly, reduction in the width of the aperture 8 is also limited.

Embodiment 2

Figure 6:
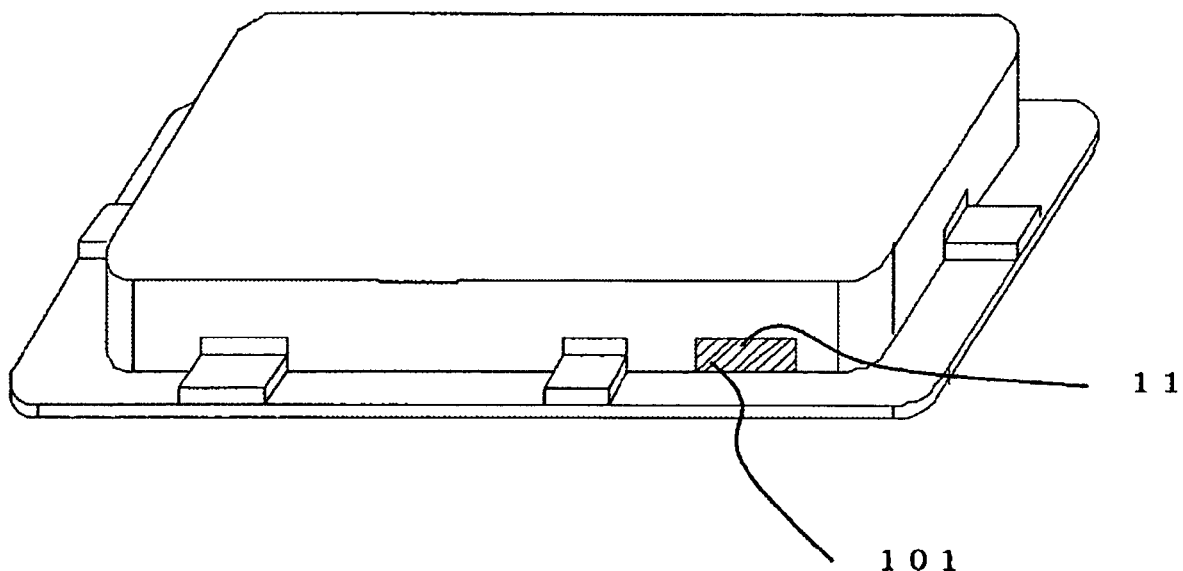
FIG. 6 is an external view of a high frequency package according to Embodiment 2 of the present invention.

FIG. 6 is an external view illustrating Embodiment 2 of a high frequency package according to the present invention. In FIG. 6, at 11 is a dummy aperture (slot-antenna aperture) that is defined by partially notching the frame 2; therefore, no bias terminals 5 exist in its immediate vicinity. The dummy aperture 11 is provided in order to eliminate spurious radio waves by taking advantage of its resonance phenomenon when unnecessary radio waves (spurious waves) exist within the used frequency bandwidth, while the rest of the configuration of the high frequency package is the same as that of Embodiment 1.

Figure 7:
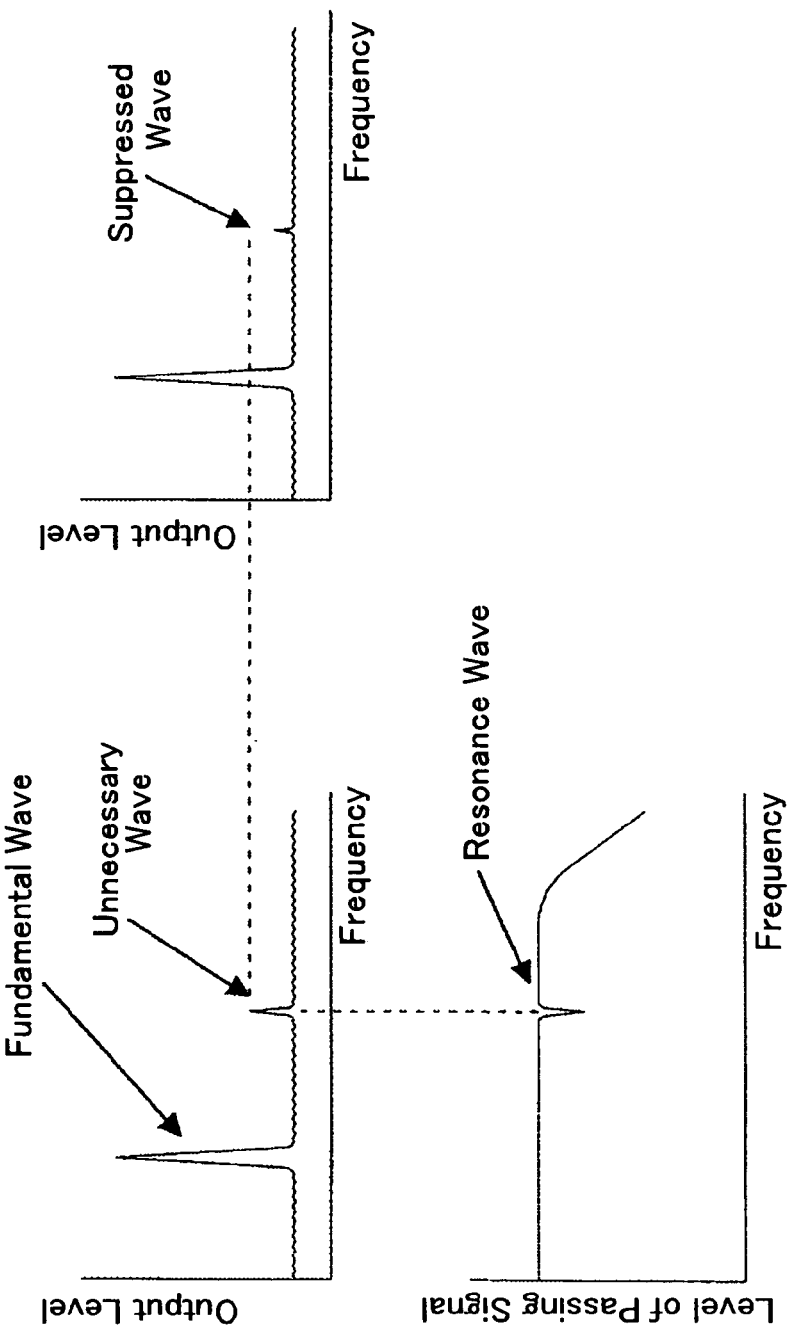
FIGS. 7A–7C are explanatory views representing a method for suppressing unnecessary electric waves.

Specifically, as indicated in FIG. 7a, the frequency of the resonance originating in the dummy aperture 11 is tuned to the frequency of a spurious radio wave that is, apart from the fundamental radio wave (desired frequency) itself in the frequency bandwidth, of relatively high output power. For instance, in cases where the fundamental radio wave exists at 10 GHz and the unnecessary radio wave at 12 GHz, the resonance frequency of the dummy aperture 11 is set to 12 GHz, as represented in FIG. 7b, by defining the width of the dummy aperture 11. In particular, in cases where a ceramic standing wall 101, which is an insulating material, fills the dummy aperture 11, since the dielectric constant between the top surface of the aperture and the bottom plate is 9, the width of the dummy aperture 11 should be less than 4.16 mm. In the manner discussed above, the spurious radio waves can be reduced as represented in FIG. 7(c).

In addition, with regard to the reduction of the spurious radio waves, the foregoing discussion has described only the dummy aperture 11; however, the same effect is also demonstrated by utilizing the resonance of the aperture 8 having the ceramic board 3.

Embodiment 3

Figure 8:
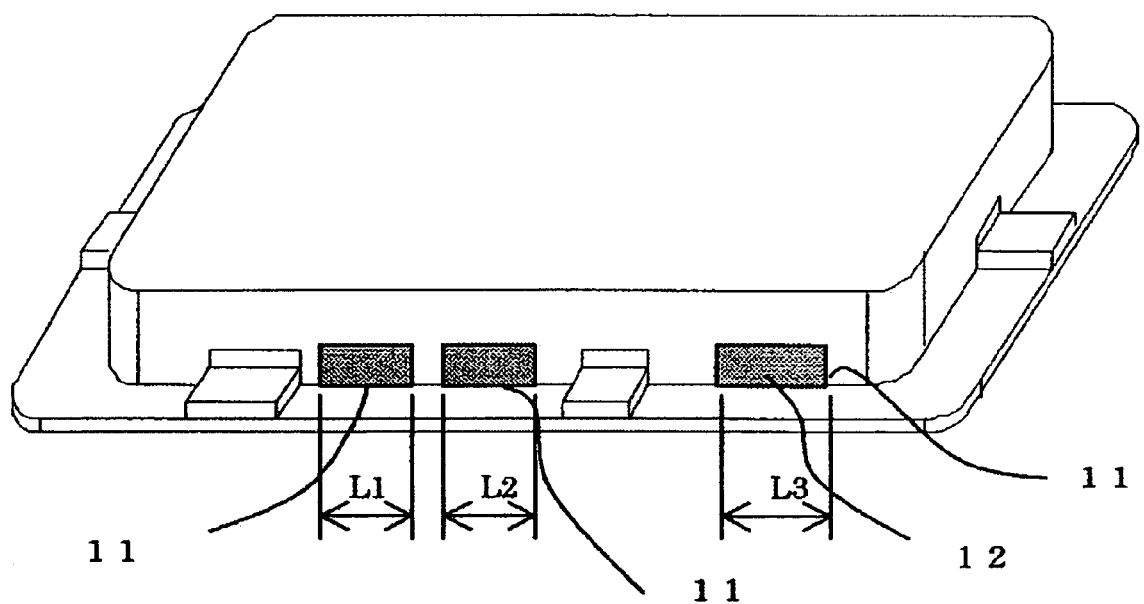
FIG. 8 is an external view of a high frequency package according to Embodiment 3 of the present invention.

As illustrated in FIG. 8, when the 12 GHz spurious radio wave ranges over a relatively wide bandwidth, —e. g., from 11.8 to 12.2 GHz—with apertures hermetically sealed with silicone resin 12 as an insulating material having a dielectric constant of approximately 4, three dummy apertures 11 having widths of 6.35, 6.25, and 6.14 mm would be provided, distributed in the appropriate places on the surface of the frame 2 that defines the sides of the package. In addition, in order to secure the bandwidth performance of the suppressed radio waves in which spurious waves are reduced, the widths for the upper and lower cut-off frequencies of the wide spurious radio waves may be those corresponding to the secondary frequencies (n=2), which are higher resonance modes. In order to suppress the spurious radio wave over a wide bandwidth, the secondary resonance (n=2) phenomenon, which is a higher-ordered resonance mode of the aperture, may also be utilized. Thus, according to Embodiment 3, even though a spurious radio wave having a relatively wide bandwidth occurs in the microwave circuitry 6 (semiconductor circuitry), the spurious radio wave can be reduced and suppressed to a low level. As this invention may be embodied in several forms without departing from the spirit of the essential characteristics thereof, the present embodiments are therefore illustrative and not restrictive, since the scope of the invention is defined by the appended claims rather than by the description preceding them, and all changes that fall within the metes and bounds of the claims, or the equivalence of such metes and bounds are therefore intended to be embraced by the claims.

What is claimed is:

1. A high frequency package comprising:
a ground plate;
a metal frame disposed on the ground plate and having an aperture for connection with an external terminal;
dielectrics disposed on the ground plate, and on which a high frequency transmission line and a plurality of input and output terminals are formed;
semiconductor circuitry contained in the metal frame;
connecting portions which connect the semiconductor circuitry to the input and output terminals; and
a metal lid for covering the space that the metal frame embraces, wherein
the frequency of the slot-resonance arising from electromagnetic resonance between the metal frame and the ground plate, is shifted outside the limit of the frequency bandwidth used in the semiconductor circuitry by changing the width of the aperture.

2. A high frequency package according to claim 1, wherein the aperture is filled with a dielectric and has no gaps therein.

3. A high frequency package according to claim 1, wherein the aperture is filled with an insulating material and has no gaps therein.

4. A high frequency package comprising:
a ground plate;
a metal frame disposed on the ground plate and having an aperture for the connection with an external terminal;
dielectrics disposed on the ground plate, and superficially on which a high frequency transmission line and a plurality of input and output terminals are formed;
semiconductor circuitry contained in the metal frame;
connecting portions which connect the semiconductor circuitry to the input and output terminals;
a metal lid for covering the space that the metal frame embraces; and
slot antenna apertures provided in the metal frame and having a width that is different from that of said aperture in the metal frame, wherein
the frequency of the slot antenna slot resonance arising from electromagnetic resonance between the metal frame and the ground plate, is set to eliminate unnecessary frequency within the frequency bandwidth used in the semiconductor circuitry by changing the width of the slot antenna aperture.

5. A high frequency package according to claim 4, further comprising a plurality of the slot antenna apertures differing from each other in width.

* * * * *